United States Patent
Takenaga et al.

(10) Patent No.: US 10,692,782 B2
(45) Date of Patent: Jun. 23, 2020

(54) CONTROL DEVICE, SUBSTRATE PROCESSING SYSTEM, SUBSTRATE PROCESSING METHOD, AND PROGRAM

(71) Applicant: Tokyo Electron Limited, Tokyo (JP)

(72) Inventors: Yuichi Takenaga, Iwate (JP); Takahito Kasai, Iwate (JP); Yozo Nagata, Mie (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 53 days.

(21) Appl. No.: 15/460,559

(22) Filed: Mar. 16, 2017

(65) Prior Publication Data

US 2017/0271215 A1 Sep. 21, 2017

(30) Foreign Application Priority Data

Mar. 17, 2016 (JP) .................. 2016-053872

(51) Int. Cl.
*H01L 21/66* (2006.01)
*G01B 21/08* (2006.01)
*G05B 19/418* (2006.01)

(52) U.S. Cl.
CPC .............. *H01L 22/20* (2013.01); *G01B 21/08* (2013.01); *G05B 19/41885* (2013.01);
(Continued)

(58) Field of Classification Search
CPC ... H01L 22/20; G01B 21/08; G05B 19/41885; G05B 2219/42155; G05B 2219/45031; Y02P 90/02
(Continued)

(56) References Cited

U.S. PATENT DOCUMENTS 6,221,787 B1 * 4/2001 Ogata .................. G03F 7/162
257/E21.259
6,278,519 B1 * 8/2001 Rosencwaig ...... G01B 11/0641
250/225
(Continued)

FOREIGN PATENT DOCUMENTS

JP 2003-090710 A 3/2003
JP 2008-218709 A 9/2008
JP 2013-207256 A 10/2013

*Primary Examiner* — James J Lee
*Assistant Examiner* — Michael W Choi
(74) *Attorney, Agent, or Firm* — Abelman, Frayne & Schwab (57) ABSTRACT

Provided is a control device for controlling an operation of a substrate processing apparatus that forms a predetermined film on a substrate and operations of a plurality of measurement devices that measure a characteristic of the predetermined film. The control device includes: an individual difference information storing unit that stores individual difference information representing a relationship between information allocated to each of the plurality of measurement devices to specify each measurement device and an individual difference of the measurement device; and a controller that corrects a measurement value of the characteristic of the predetermined film measured by the measurement device based on information specifying the measurement device that has measured the characteristic of the predetermined film and the individual difference information stored in the individual difference information storing unit.

9 Claims, 3 Drawing Sheets (52) U.S. Cl.
CPC .............. *G05B 2219/42155* (2013.01); *G05B 2219/45031* (2013.01); *Y02P 90/02* (2015.11)

(58) Field of Classification Search
USPC ........................................................ 700/121
See application file for complete search history.

(56) References Cited

U.S. PATENT DOCUMENTS

| | | | |
|---|---|---|---|
| 6,978,189 B1* | 12/2005 | Bode ................. | H01L 21/67253 438/5 |
| 2003/0045961 A1* | 3/2003 | Nakao ............... | H01L 21/67253 700/121 |
| 2004/0215365 A1* | 10/2004 | Obara ..................... | C23C 16/52 700/213 |
| 2007/0013388 A1* | 1/2007 | Wang ................... | G05B 19/401 324/601 |
| 2008/0086228 A1* | 4/2008 | Yamaji ................... | C23C 16/52 700/109 |
| 2014/0017824 A1* | 1/2014 | Iizumi ............... | H01L 21/30625 438/16 |
| 2014/0268183 A1* | 9/2014 | Furuta ................. | G01B 5/0011 356/630 |

* cited by examiner

| MEASURING DEVICE ID | INDIVIDUAL DIFFERENCE[nm] |
|---|---|
| A | 0 |
| B | +0.01 |
| C | −0.02 |

FIG. 4

CONTROL DEVICE, SUBSTRATE PROCESSING SYSTEM, SUBSTRATE PROCESSING METHOD, AND PROGRAM

CROSS-REFERENCE TO RELATED APPLICATIONS

This application is based on and claims priority from Japanese Patent Application No. 2016-053872 filed on Mar. 17, 2016 with the Japan Patent Office, the disclosure of which is incorporated herein in its entirety by reference.

TECHNICAL FIELD

The present disclosure relates to a control device, a substrate processing system, a substrate processing method, and a program.

BACKGROUND

In manufacturing a semiconductor device, when forming a film having desired characteristics on a substrate such as, for example, a semiconductor wafer (hereinafter, referred to as a "wafer"), an optimum film formation condition for obtaining the film having the desired characteristics is calculated in advance, and a film formation is performed on the substrate by using the film formation condition. Calculating the optimum film formation condition requires knowledge and experience related to semiconductor manufacturing apparatuses and semiconductor processes. Thus, the optimum film formation condition may not be easily calculated in some cases.

In the related art, as a system for calculating an optimum film formation condition, there is known a thermal processing system in which, when an operator merely inputs a target film thickness, a controller calculates an optimum temperature for approaching the target film thickness (see, e.g., Japanese Patent Laid-Open Publication No. 2013-207256). In the system, the controller refers to film thickness data measured by a film thickness measuring device and calculates the optimum film formation condition.

SUMMARY

According to an aspect, the present disclosure provides a control device for controlling an operation of a substrate processing apparatus that forms a predetermined film on a substrate and operations of a plurality of measurement devices that measure a characteristic of the predetermined film. The control device includes: an individual difference information storing unit that stores individual difference information representing a relationship between information allocated to each of the plurality of measurement devices to specify each measurement device and an individual difference of the measurement device; and a controller that corrects a measurement value of the characteristic of the predetermined film measured by the measurement device based on information specifying the measurement device that has measured the characteristic of the predetermined film and the individual difference information stored in the individual difference information storing unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a semiconductor device manufacturing factory, when measuring a film thickness of a film formed on a substrate, the same film thickness measuring device is not always used, but an arbitrary film thickness measuring device may be used among a plurality of film thickness measuring devices provided in the factory. In this case, the film thicknesses to be measured will vary due to the individual difference of the film thickness measuring devices.

Thus, when a variation occurs in a measured film thickness, the optimum film formation conditions may not be calculated in the above-described system.

Accordingly, in an aspect, the present disclosure is to provide a control device capable of reducing the influence of individual differences of measurement devices.

According to an aspect, the present disclosure provides a control device for controlling an operation of a substrate processing apparatus that forms a predetermined film on a substrate and operations of a plurality of measurement devices that measure a characteristic of the predetermined film. The control device includes: an individual difference information storing unit that stores individual difference information representing a relationship between information allocated to each of the plurality of measurement devices to specify each measurement device and an individual difference of the measurement device; and a controller that corrects a measurement value of the characteristic of the predetermined film measured by the measurement device based on information specifying the measurement device that has measured the characteristic of the predetermined film and the individual difference information stored in the individual difference information storing unit.

The above-described control device further includes a model storing unit that stores a process model representing an influence of a condition for forming the predetermined film on the characteristic of the predetermined film. The controller calculates a condition for forming the predetermined film based on the corrected measurement value and the process model stored in the model storing unit.

In above-described control device, the characteristic of the predetermined film is a film thickness, and the controller determines whether or not to correct the measurement value of the characteristic of the predetermined film measured by the measurement device based on a target film thickness of the predetermined film to be formed on the substrate.

According to another aspect, the present disclosure provides a substrate processing system including: a substrate processing apparatus that forms a predetermined film on a substrate; a plurality of measurement devices that measure a characteristic of the predetermined film; and a control device that controls an operation of the substrate processing apparatus and operations of the plurality of measurement devices. The control device includes: an individual difference information storing unit that stores individual difference information representing a relationship between information allocated to each of the plurality of measurement devices to specify each measurement device and an individual difference of the measurement device; and a controller that corrects a measurement value of the characteristic of the predetermined film measured by the measurement device based on information specifying the measurement device that has measured the characteristic of the predetermined film and the individual difference information stored in the individual difference information storing unit.

According to still another aspect, the present disclosure provides a substrate processing method including: forming a predetermined film on a substrate; measuring a characteristic of the predetermined film; and correcting a measurement value of the characteristic of the predetermined film measured by a measurement device based on information specifying the measurement device that has measured the characteristic of the predetermined film, and individual difference information representing a relationship between the information specifying the measurement device and an individual difference of the measurement device.

According to yet another aspect, the present disclosure provides a non-transitory computer-readable storage medium that stores a computer program which, when executed, causes a computer to perform the above-described substrate processing method.

According to the control device of the present disclosure, the influence of the individual differences of the measurement devices may be reduced.

Hereinafter, an exemplary embodiment of the present disclosure will be described with reference to the drawings. In the present specification and drawings, components having substantially the same configurations will be denoted by the same symbols, and the overlapping descriptions thereof will be omitted.

(Substrate Processing Apparatus)

A substrate processing apparatus of the exemplary embodiment will be described. The substrate processing apparatus of the exemplary embodiment is an apparatus capable of accommodating a substrate holder in which a plurality of semiconductor wafers (hereinafter, referred to as "wafers") as exemplary substrates are held at a predetermined interval in the vertical direction, and simultaneously performing a film formation processing on the plurality of wafers.

Figure 1:
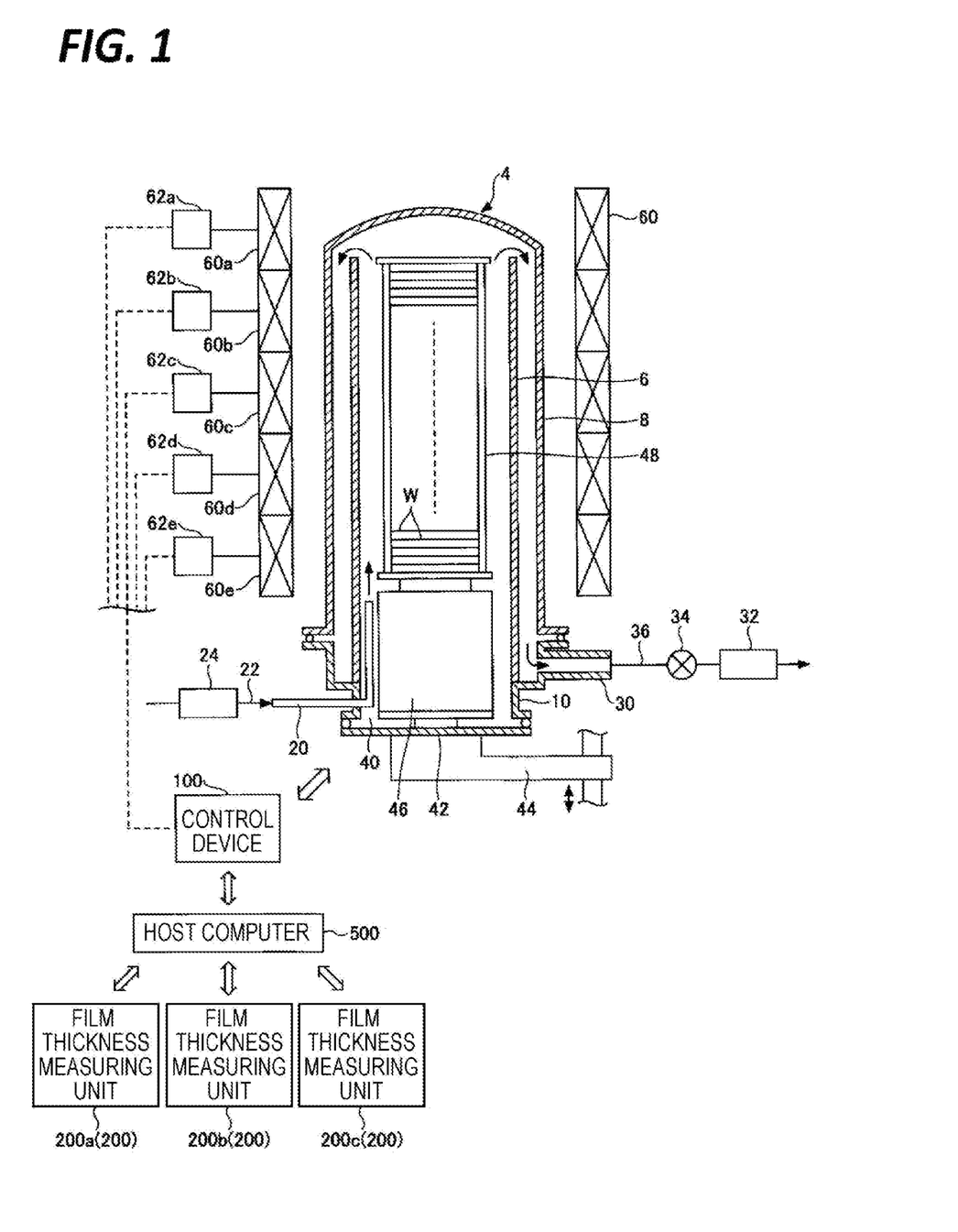
FIG. 1 is a schematic diagram illustrating an exemplary substrate processing apparatus according to an exemplary embodiment of the present disclosure.

Hereinafter, descriptions will be made with reference to FIG. 1. FIG. 1 is a schematic diagram illustrating an exemplary substrate processing apparatus according to an exemplary embodiment of the present disclosure.

As illustrated in FIG. 1, the substrate processing apparatus includes a substantially cylindrical processing container 4 of which the longitudinal direction is a vertical direction. The processing container 4 has a dual pipe structure including an inner cylinder 6 of a cylindrical body and an outer cylinder 8 having a ceiling, which is arranged coaxially outside the inner cylinder 6. The inner cylinder 6 and the outer cylinder 8 are made of a heat-resistant material such as, for example, quartz.

The inner cylinder 6 and the outer cylinder 8 are held at the lower end portions thereof by a manifold 10 made of, for example, stainless steel. The manifold 10 is fixed to, for example, a base plate (not illustrated). Since the manifold 10 defines a substantially cylindrical internal space together with the inner cylinder 6 and the outer cylinder 8, it is assumed that the manifold 10 forms a part of the processing container 4. That is, the processing container 4 includes the inner cylinder 6 and the outer cylinder 8 made of a heat-resistant material (e.g., quartz), and a manifold 10 made of, for example, stainless steel. The manifold 10 is provided in the lower portion of the lateral surface of the processing container 4 to hold the inner cylinder 6 and the outer cylinder 8 from the lower side.

The manifold 10 is provided with a gas introduction portion 20 to introduce various kinds of gases, for example, a processing gas such as a film forming gas used for a film formation processing and a purge gas used for a purge processing, into the processing container 4. Although FIG. 1 illustrates a configuration in which one gas introduction portion 20 is provided, the present disclosure is not limited thereto. A plurality of gas introduction portions 20 may be provided depending on, for example, the kinds of gases to be used.

The kind of the film forming gas is not particularly limited, but may be appropriately selected depending on the type of the film to be formed. For example, in a case of forming a polysilicon film on a wafer W, a gas containing monosilane ($SiH_4$), for example, may be used as the film forming gas.

The kind of the purge gas is not particularly limited. For example, an inert gas (e.g., nitrogen ($N_2$) gas) may be used.

The gas introduction portion 20 is connected with an introduction pipe 22 to introduce various kinds of gases into the processing container 4. The introduction pipe 22 includes, for example, a flow rate adjusting unit 24 (e.g., a mass flow controller) or a valve (not illustrated) interposed therein to adjust the gas flow rate.

Further, the manifold 10 is provided with a gas exhaust portion 30 to exhaust the atmosphere inside the processing container 4. The gas exhaust portion 30 is connected with an exhaust pipe 36 including a vacuum pump 32 and an opening variable valve 34, which are capable of controllably decompressing the inside of the processing container 4.

A furnace opening 40 is formed in the lower end portion of the manifold 10, and the furnace opening 40 is provided with a disk-like lid 42 made of, for example, stainless steel. The lid 42 is provided to be elevatable by, for example, an elevating mechanism 44 that functions as a boat elevator, and is configured to hermetically seal the furnace opening 40.

For example, a heat insulating cylinder 46 made of quartz is provided on the lid 42. For example, a wafer boat 48 made of quartz is placed on the heat insulating cylinder 46 to hold, for example, about 50 to 175 wafers W in a horizontal state at predetermined intervals in multi-tiers.

The wafer boat 48 is loaded (carried in) to the inside of the processing container 4 by moving up the lid 42 using the elevating mechanism 44, and various film formation processings are performed on the wafers W held in the wafer boat 48. After various film formation processings are performed, the wafer boat 48 is unloaded (carried out) from the inside of the processing container 4 to the lower loading region by moving down the lid 42 using the elevating mechanism 44.

For example, a cylindrical heater 60, which is capable of controllably heating the processing container 4 to a predetermined temperature, is provided on the outer peripheral side of the processing container 4.

The heater 60 is divided into a plurality of zones, and heaters 60a to 60e are provided from the upper side to the lower side in the vertical direction. The heaters 60a to 60e are configured to independently control the heat generation amounts by power controllers 62a to 62e, respectively. Further, temperature sensors (not illustrated) are provided on the inner wall of the inner cylinder 6 and/or the outer wall of the outer cylinder 8 in correspondence with the heaters 60a to 60e. Hereinafter, the zones provided with the heaters 60a to 60e are referred to as zones 1 to 5, respectively. Although FIG. 1 illustrates a configuration in which the heater 60 is divided into five (5) zones, the present disclosure is not limited thereto. For example, the heater 60 may be divided into four (4) or less zones, or six (6) or more zones, from the upper side to the lower side in the vertical direction. Further, the heater 60 may not be divided into a plurality of zones.

The plurality of wafers W placed on the wafer boat 48 constitute one batch, and various film formation processings are performed by one batch. Further, at least one of the wafers W placed on the wafer boat 48 may be a monitor wafer. Further, the monitor wafer may be arranged corresponding to each of the divided heaters 60a to 60e.

Further, the substrate processing apparatus of the exemplary embodiment includes a control device 100 such as, for example, a computer to control the operation of the entire apparatus. The control device 100 is connected to a host computer 500 by a wired or wireless communication means, and the substrate processing apparatus constitutes a substrate processing system. The substrate processing system may include a plurality of film thickness measuring devices 200 that measure the film thickness of a film formed using the substrate processing apparatus. Each of the film thickness measuring devices 200 is connected to a host computer 500 by a wired or wireless communication means. The film thickness measuring device 200 is an example of the measurement device. FIG. 1 illustrates three film thickness measuring devices 200a, 200b, and 200c by way of an example.

(Control Device)

Figure 2:
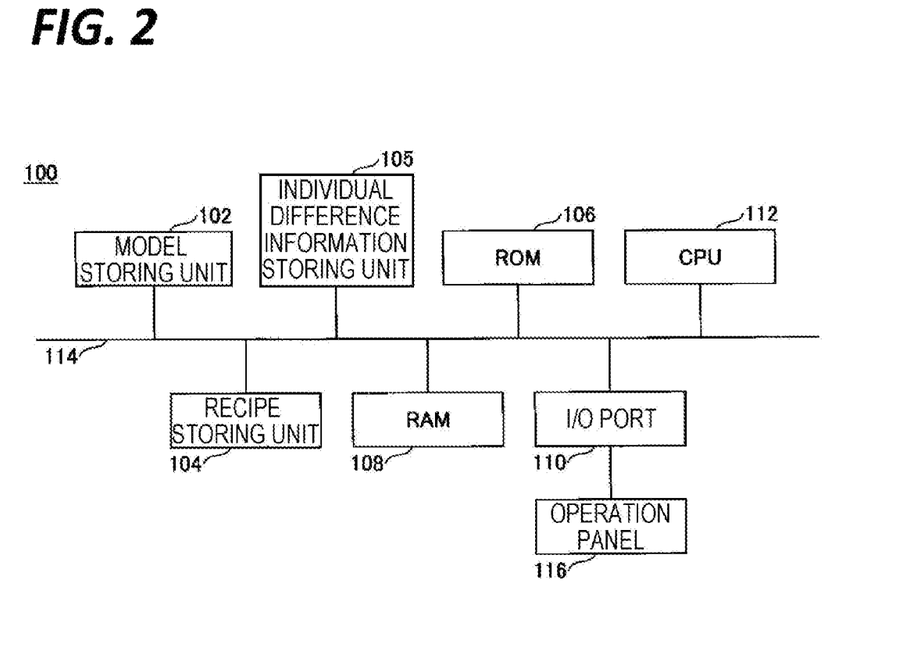
FIG. 2 is a schematic diagram illustrating an exemplary control device according to an exemplary embodiment of the present disclosure.

The control device 100 of the exemplary embodiment will be described with reference to FIG. 2. FIG. 2 is a schematic diagram illustrating an exemplary control device according to the exemplary embodiment.

As illustrated in FIG. 2, the control device 100 includes a model storing unit 102, an recipe storing unit 104, an individual difference information storing unit 105, a read only memory (ROM) 106, a random access memory (RAM) 108, an I/O port 110, a central processing unit (CPU) 112, and a bus 114 that connects these components with each other.

The model storing unit 102 stores, for example, a process model and a thermal model.

The process model represents an influence of film formation conditions on a film formation result, and the examples of the process model may include a temperature-film thickness model, a time-film thickness model, a pressure-film thickness model, and a gas flow rate-film thickness model. The temperature-film thickness model represents an influence of the temperature of the wafer W on the film thickness of the formed film. The time-film thickness model represents an influence of the film formation time on the film thickness of the formed film. The pressure-film thickness model represents an influence of the pressure in the processing container 4 on the film thickness of the formed film. The gas flow rate-film thickness model represents an influence of the flow rate of the film forming gas on the film thickness of the formed film.

Further, another process model may be exemplified by a model representing an influence of film formation conditions such as, for example, the temperature of the wafer W, the film formation time, the pressure in the processing container 4, and the flow rate of the film forming gas on characteristics different from the film thickness of the formed film, for example, an impurity concentration, a sheet resistance, and a reflectance.

The model storing unit 102 may store some or all of the process models described above.

In addition to the process models described above, the model storing unit 102 stores a thermal model.

The thermal model is a model to be referred to, for example, when determining the set temperature of the heater 60 such that the temperature in the processing container 4 becomes a temperature calculated by the model representing the influence of the temperature of the wafer W on the film formation result.

Further, in the models, since a non-optimal numerical value of the default is also considered depending on the film formation conditions or the state of the substrate processing apparatus, a learning function may be loaded by adding, for example, an expansion Kalman filter to software, so as to perform learning of the models.

The recipe storing unit 104 stores a process recipe that determines a control procedure depending on the kind of the film formation processings performed in the substrate processing apparatus. The process recipe is a recipe prepared for each film formation processing actually performed by an operator. The process recipe regulates film formation conditions including, for example, a temperature change, a pressure change, a timing of starting or stopping the supply of various gases, and a supply amount of various gases, from the carry-in of the wafer W into the substrate processing apparatus to the carry-out of the processed wafer W.

The individual difference information storing unit 105 stores individual difference information representing a relationship between information allocated to each of the plurality of measuring devices 200 to specify each measuring device 200 (hereinafter, referred to as a "measuring device ID") and an individual difference of the film thickness measuring device 200.

Figure 3:
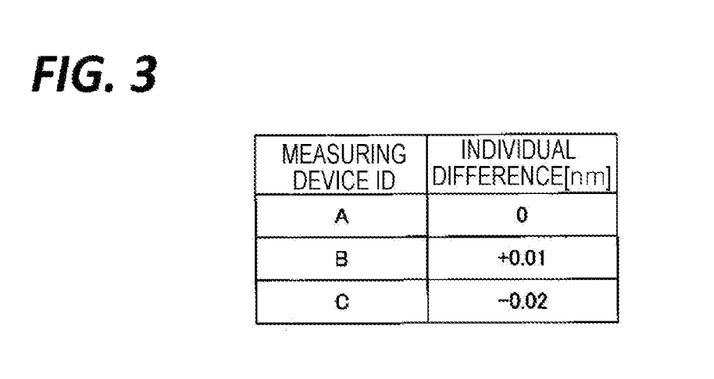
FIG. 3 is a table illustrating an exemplary relationship between a measuring device ID and an individual difference.

The individual difference information will be described with reference to FIG. 3. FIG. 3 is a table illustrating an exemplary relationship between a measuring device ID and an individual difference, in which the individual difference (nm) of the film thickness is associated with each measuring device ID of the film thickness measuring devices 200. FIG. 3 illustrates a relationship between the measuring instrument ID and the individual difference when the film thickness measuring instrument 200a having the measuring instrument ID of "A" is set as a reference.

As illustrated in FIG. 3, the individual difference of the film thickness measuring device 200a having the reference measuring device ID of "A" is 0 nm, the individual difference of the film thickness measuring device 200b having the measuring device ID of "B" is +0.01 nm, and the individual difference of the film thickness measuring device 200c having the measuring device ID of "C" is −0.02 nm. That is, in the table illustrated in FIG. 3, when measuring the same predetermined film, the film thickness measured by the film thickness measuring device 200b having the measuring device ID of "B" is 0.01 nm thicker than that measured by the film thickness measuring device 200a having the measuring device ID of "A." Further, when measuring the same predetermined film, the film thickness measured by the film thickness measuring device 200b having the measuring device ID of "C" is 0.02 nm thinner than that measured by the film thickness measuring device 200a having the measuring device ID of "A."

As an example of the individual difference information, descriptions have been made on the table illustrating the relationship between the measuring instrument ID and the individual difference in the case where the film thickness measuring instrument 200a having the measuring instrument ID of "A" is used as the reference. However, the present disclosure is not limited thereto. For example, the film thickness measuring device 200b having the measuring device ID of "B" may be used as a reference, or the film thickness measuring device 200c having the measuring device ID of "C" may be used as a reference. Alternatively, for example, a film thickness measuring device 200 prepared separately from the film thickness measuring devices 200a, 200b, 200c having the measuring device IDs of "A," "B," and "C," respectively, may be used as a reference.

Further, the individual difference information storing unit 105 may store, for example, a plurality of tables for each process type and target film thickness in advance.

The ROM 106 is a storage medium that is constituted by, for example, an electrically erasable programmable read-only memory (EEPROM), a flash memory, or a hard disk, and stores an operation program of the CPU 112.

The RAM 108 functions as a work area of the CPU 112.

The I/O port 110 supplies a measurement signal for the film formation conditions such as, for example, a temperature, a pressure, and a gas flow rate to the CPU 112. Further, the I/O port 110 outputs the control signal output from the CPU 112 to respective units (including the power controller 62, the controller (not illustrated) of the opening variable valve 34, and the flow rate adjusting unit 24). Further, the I/O port 110 is connected with an operation panel 116 with which an operator operates the substrate processing apparatus.

The CPU 112 executes the operation program stored in the ROM 106, and according to the instructions from the operation panel 116, controls the operations of the substrate processing apparatus along the process recipe stored in the recipe storing unit 104.

Further, the CPU 112 calculates an optimum film formation condition based on the process model stored in the model storing unit 102. At this time, film formation conditions satisfying, for example, the in-plane uniformity of the wafer W or the inter-plane uniformity between the wafers W are calculated, based on, for example, a desired film characteristic stored in the read process recipe using the optimization algorithm such as, for example, the linear programming method or the quadratic programming method.

Further, the CPU 112 determines a set temperature of the heater 60 to be a temperature of the wafer W calculated by the process model, based on the thermal model stored in the model storing unit 102.

Further, the CPU 112 corrects the characteristic of the predetermined film measured by the film thickness measuring device 200, based on the individual difference information stored in the individual difference information storing unit 105.

The bus 114 transmits information between the respective units.

Meanwhile, in a semiconductor device manufacturing factory, when measuring a film thickness of a film formed on a wafer W, the same film thickness measuring device is not always used, but an arbitrary film thickness measuring device 200 may be used among a plurality of film thickness measuring devices 200 provided in the factory. In this case, the film thickness to be measured may varies due to the influence of the individual difference of the film thickness measuring device 200. Thus, the optimum film formation condition may not be calculated in some cases. In particular, for example, in a process required to adjust the film thickness in units of 0.01 nm, it is difficult to calculate the optimum film formation condition due to the influence of the individual difference of the film thickness measuring device 200.

In the exemplary embodiment, therefore, the control device 100 corrects the measurement value of the characteristic of the predetermined film measured by the film thickness measuring device 200, based on the measuring device ID of the film thickness measuring device 200 which has measured the characteristic of the predetermined film and the individual difference information stored in the individual difference information storing unit 105. Therefore, the influence of the individual difference of the film thickness measuring device 200 may be reduced. As a result, a process control may be stably performed even when there is an influence of the individual difference of the film thickness measuring device 200.

Next, descriptions will be made on an operation (adjustment processing) of the control device 100 capable of reducing the influence of the individual difference of the film thickness measuring device 200 by taking a case where a polysilicon film is formed on the wafer W, as an example.

Figure 4:
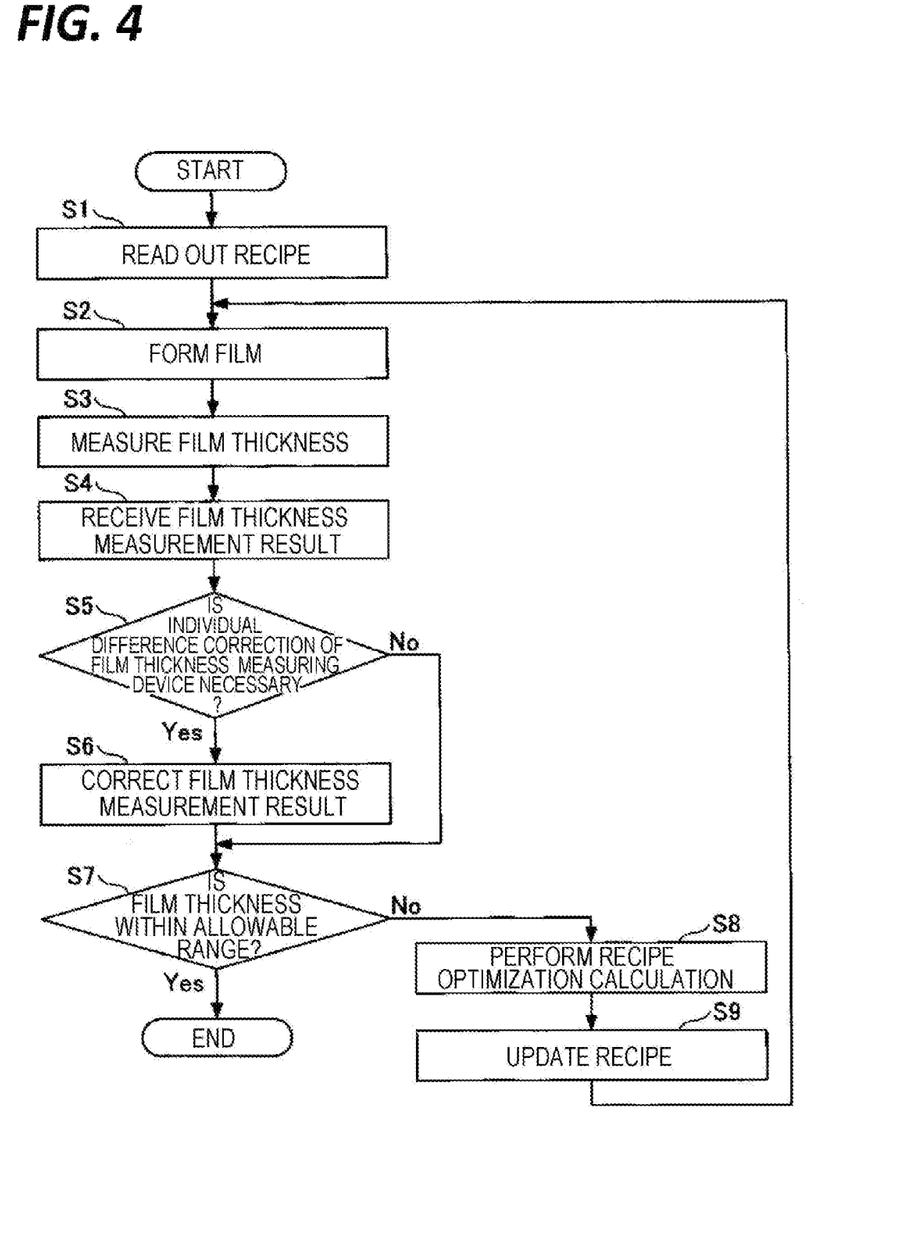
FIG. 4 is a flowchart illustrating an exemplary operation of the control device according to the exemplary embodiment.

Hereinafter, descriptions will be made with reference to FIG. 4. FIG. 4 is a flowchart illustrating an exemplary operation of the control device according to the exemplary embodiment.

The adjustment processing of the exemplary embodiment may be formed at a set-up stage before the film formation processing is performed, or simultaneously with the film formation processing. Further, in the adjustment processing, the operator operates the operation panel 116 to select the kind of the process (e.g., film formation using SiH4 gas) and input a film thickness (target film thickness) of the polysilicon film to be formed for each zone. In addition, the operator operates the operation panel 116 may input information whether or not to correct the individual difference of the film thickness measuring device 200.

When necessary information (e.g., the process type) is input, and a start instruction is received, the CPU 112 reads the process recipe corresponding to the input process type from the recipe storing unit 104 (step S1).

Next, a polysilicon film is formed on the wafer W (step S2). Specifically, the CPU 112 causes the lid 42 to be moved down so that the wafer boat 48 on which the wafer W is mounted at least in each zone is placed on the lid 42. Subsequently, the CPU 112 causes the lid 42 to be moved up so that the wafer boat 48 is carried into the processing container 4. Subsequently, the CPU 112 controls, for example, the flow rate adjusting unit 24, the opening variable valve 34, and the power controllers 62a to 62e according to the process recipe read from the recipe storing unit 104 to form a polysilicon film on the wafer W.

When the formation of the polysilicon film is completed, the CPU 112 causes the lid 42 to be moved down so that the wafer W on which the polysilicon film is formed is carried out. The host computer 500 causes the carried-out wafer W to be conveyed to the film thickness measuring device 200 to measure the film thickness of the polysilicon film (step S3). When the film thickness of the polysilicon film is measured, the film thickness measuring device 200 transmits the measuring device ID and the measurement value of the film thickness (film thickness measurement result) to the CPU 112 via the host computer 500. Alternatively, the operator may operate the operation panel 116 to input the measuring device ID and the measurement value of the film thickness.

The CPU 112 receives the measuring device ID and the measurement value of the film thickness (step S4). Then, the CPU 112 determines whether or not the individual difference correction of the film thickness measuring device 200 is necessary (step S5). The determination of the film thickness measuring device 200 whether or not individual difference correction of the film thickness measuring device 200 is necessary is performed depending on, for example, the process type, the target film thickness, and the presence/absence of performance of the individual difference correction.

Specifically, for example, when the process type is "thermal oxidation," "CVD-Poly," "CVD-SiN," or "ALD-SiN," and the presence/absence of performance of the individual difference correction is "presence," the CPU 112 determines that the individual difference correction of the film thickness measuring device 200 is necessary. The "thermal oxidation" represents a process of forming a silicon oxide film by thermal oxidation. The "CVD-Poly" represents a process of forming a polysilicon film by chemical vapor deposition (CVD). The "CVD-SiN" represents a process of forming a silicon nitride film by CVD. In addition, the "ALD-SiN" represents a process of forming a silicon nitride film by atomic layer deposition (ALD).

Further, for example, in a case of a thin film process in which the target film thickness is a predetermined film thickness or less, the CPU 112 determines that the individual difference correction of the film thickness measuring device 200 is necessary. The predetermined film thickness may be set to a film thickness in which the influence of the individual difference of the film thickness measuring device 200 becomes a problem, or may be determined according to, for example, the type and the resolution of the film thickness measuring device 200.

When it is determined that the individual difference correction of the film thickness measuring device 200 is necessary in step S5, the CPU 112 corrects the measurement value of the film thickness (step S6). Specifically, the CPU 112 corrects the measurement value of the film thickness based on the measuring device ID received in step S4, and the table representing the relationship between the measuring device ID and the individual difference stored in the individual difference storing unit 105 (see, e.g., FIG. 3). For example, when the measuring instrument ID received in step S4 is "B," the CPU 112 calculates a value obtained by subtracting 0.01 from the film thickness received in step S4 as a corrected film thickness, based on the table representing the relationship between the measuring instrument ID and the individual difference stored in the individual difference information storing unit 105. When it is determined that the individual difference correction of the film thickness measuring device 200 is not necessary in step S5, the CPU 112 proceeds to step S7 without correcting the measurement value of the film thickness.

Subsequently, the CPU 112 determines whether or not the measurement value of the film thickness of the polysilicon film falls within the allowable range of the target film thickness (step S7). The measurement value of the film thickness of the polysilicon film means a measurement value of the film thickness of the polysilicon film after the correction when individual difference correction is performed, or means a measurement value of the film thickness of the polysilicon film received in step S4 when the individual difference correction is not performed. Further, the wording "within an allowable range" means that it is included within a predetermined allowable range from the input target film thickness, for example, within ±1% from the input target film thickness.

When it is determined in step S7 that the film thickness of the polysilicon film falls within the allowable range of the target film thickness, the CPU 112 terminates the adjustment processing. When it is determined in step S7 that the film thickness of the polysilicon film does not fall within the allowable range of the target film thickness, the CPU 112 executes a recipe optimization calculation (step S8). In the recipe optimization calculation, the temperature of the wafer W and the film formation time in each zone, which are able to achieve the target film thickness, are calculated using the optimization algorithm, for example, from the process model stored in the model storing unit 102. Further, the set temperatures of the heaters 60a to 60e are calculated so as to achieve the temperature of the wafer W calculated by the process model, based on the thermal model stored in the model storing unit 102.

Subsequently, the CPU 112 updates the set temperatures of the heaters 60a to 60e and the film formation time of the read process recipe with the set temperatures of the heaters 60a to 60e and the film formation time calculated in step S8 (step S9), and returns the operation to step S2. The process recipe may be updated by overwriting the existing process recipe. Alternatively, a new process recipe may be prepared separately from the existing process recipe.

When the adjustment processing is completed, the CPU 112 executes a film formation processing to form a polysilicon film on the wafer W. Specifically, the CPU 112 causes the lid 44 to be moved down by the elevating mechanism 44 so that the wafer boat 48 on which the wafer W is mounted is placed on the lid 42. Subsequently, the CPU 112 causes the lid 42 to be moved up by the elevating mechanism 44 so that the wafer boat 48 is carried into the processing container 4. Subsequently, the CPU 112 controls, for example, the flow rate adjusting unit 24, the opening variable valve 34, and the power controllers 62a to 62e according to the process recipe read from the recipe storing unit 104 to form a polysilicon film on the wafer W.

As described above, in the exemplary embodiment, the control device 100 corrects the measurement value of the characteristic of the predetermined film measured by the film thickness measuring device 200, based on the measuring device ID of the film thickness measuring device 200 which has measured the characteristic of the predetermined film and the individual difference information stored in the individual difference information storing unit 105. Therefore, the influence of the individual difference of the film thickness measuring device 200 may be reduced. As a result, process control may be stably performed even when there is an influence of the individual difference of the film thickness measuring device 200.

The control device, the substrate processing apparatus, the substrate processing method, and the program have been described by means of the exemplary embodiment, but the present disclosure is not limited to the exemplary embodiments, and various changes and modifications may be made within the spirit of the present disclosure.

In the exemplary embodiment, descriptions have been made on an exemplary batch type apparatus in which one batch is constituted by a plurality of wafers W placed on a wafer boat 48, and film formation processing is performed in units of one batch, but the present disclosure is not limited thereto. For example, it may be a semi-batch type apparatus which collectively performs a film formation processing on a plurality of wafers W placed on a holder, or a single wafer type apparatus which performs a film formation processing one by one.

Further, in the exemplary embodiment, the film thickness measuring device 200 has been described as an example of the measurement device, but the present disclosure is not limited thereto. A measuring device that measures a characteristic other than the film thickness of the formed film (e.g., impurity concentration, a sheet resistance, or a reflectance) may be used.

Further, in the exemplary embodiment, descriptions have been made on an exemplary case where the control apparatus 100 for controlling the operation of the substrate processing apparatus performs an adjustment processing, but the present disclosure is not limited thereto. For example, the adjustment processing may be performed by a control device (group controller) that collectively manages a plurality of apparatuses, or the host computer 500.

Further, in the exemplary embodiment, descriptions have been made on a mode of utilizing the result of the individual difference correction for the recipe optimization calculation, but the present disclosure is not limited thereto. For example, the result of the individual difference correction may be used for diagnosis of the health condition of the apparatus such as, for example, apparatus fault detection and classification (FDC) or statistical process control (SPC).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A controller for controlling an operation of a substrate processing apparatus, the controller comprising:
a memory that stores a device identifier for each of a plurality of measurement devices that measure a film thickness of a film formed on a substrate by the substrate processing apparatus and a preset difference information value corresponding to each of the device identifiers that represents a measured thickness correction amount for the respective measurement device to account for variances in thickness measurement accuracy among the plurality of measurement devices; and
a processor that corrects a measurement value of the film thickness of the film measured by one of the plurality of measurement devices based on the difference information value corresponding to the device identifier of the one measurement device that has measured the thickness of the film among the plurality of measurement devices,
wherein each of the plurality of measurement devices is separate from the substrate processing apparatus,
wherein the processor determines whether or not the corrected measurement value of the film thickness of the film falls within an allowable range of a target film thickness.

2. The controller of claim 1, wherein
the memory further stores a process model representing process conditions for forming the film on the substrate; and
the processor is further configured to execute a recipe optimization calculation for forming the film based on the corrected measurement value and the process model stored in the memory when the corrected measurement value of the film thickness of the film does not fall within the allowable range of the target film thickness.

3. The controller of claim 2, wherein
the processor is further configured to update the process model based on the recipe optimization calculation and to form a next film having an adjusted film thickness by using the updated process model.

4. A substrate processing method comprising:
forming a film on a substrate by a substrate processing apparatus;
measuring, by one of a plurality of measurement devices, a thickness of the film, each measurement device having a device identifier;
correcting a measurement value of the thickness of the film measured by one of the plurality of measurement devices based on a preset difference information value corresponding to the device identifier of the one measurement device that has measured the thickness of the film among the plurality of measurement devices, the difference information value representing a measured thickness correction amount for the respective measurement device to account for variances in thickness measurement accuracy among the plurality of measurement devices; and
determining whether the corrected measurement value of the film thickness of the film within an allowable range of a target film thickness,
wherein each of the plurality of measurement devices is separate from the substrate processing apparatus.

5. The substrate processing method of claim 4, further comprising:
executing a recipe optimization calculation based on the corrected measurement value and a process model representing process conditions for forming the film on the substrate when the corrected measurement value of the film thickness of the film does not fall within the allowable range of the target film thickness.

6. The substrate processing method of claim 5, further comprising:
updating the process model based on the recipe optimization calculation; and
forming a next film having an adjusted film thickness by using the updated process model.

7. A non-transitory computer-readable storage medium having stored therein a computer program for a process, the process comprising:
forming a film on a substrate by a substrate processing apparatus;
measuring, by one of a plurality of measurement devices, a thickness of the film, each measurement device having a device identifier;
correcting a measurement value of the thickness of the film measured by one of the plurality of measurement devices based on a preset difference information value corresponding to the device identifier of the one measurement device that has measured the thickness of the film among the plurality of measurement devices, the difference information value representing a measured thickness correction amount for the respective measurement device to account for variances in thickness measurement accuracy among the plurality of measurement devices; and determining whether the corrected measurement value of the film thickness of the film falls within an allowable range of a target film thickness, wherein each of the plurality of measurement devices is separate from the substrate processing apparatus.

8. The non-transitory computer-readable storage medium according to claim 7, the process further comprising:

executing a recipe optimization calculation based on the corrected measurement value and a process model representing process conditions for forming the film on the substrate when the corrected measurement value of the film thickness of the film does not fall within the allowable range of the target film thickness.

9. The non-transitory computer-readable storage medium according to claim 8, the process further comprising:

updating the process model based on the recipe optimization calculation; and forming a next film having an adjusted film thickness by using the updated process model.

* * * * *